(12) United States Patent
Agano

(10) Patent No.: US 7,135,685 B2
(45) Date of Patent: Nov. 14, 2006

(54) SOLID STATE DETECTOR

(75) Inventor: Toshitaka Agano, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 122 days.

(21) Appl. No.: 10/342,175

(22) Filed: Jan. 15, 2003

(65) Prior Publication Data
US 2003/0132385 A1   Jul. 17, 2003

(30) Foreign Application Priority Data
Jan. 15, 2002   (JP) .............................. 2002-005849

(51) Int. Cl.
H01L 27/146 (2006.01)
G01T 1/20 (2006.01)
(52) U.S. Cl. .............................. 250/370.09; 250/370.11
(58) Field of Classification Search ........... 250/370.09, 250/370.11
See application file for complete search history.

(56) References Cited

U.S. PATENT DOCUMENTS

| | | | |
|---|---|---|---|
| 4,803,359 A | 2/1989 | Hosoi et al. | |
| 5,880,472 A * | 3/1999 | Polischuk et al. | 250/370.09 |
| 6,268,614 B1 | 7/2001 | Imai | |
| 6,376,857 B1 | 4/2002 | Imai | |
| 6,483,567 B1 | 11/2002 | Okada | |
| 6,559,451 B1 | 5/2003 | Izumi et al. | |
| 6,600,158 B1 * | 7/2003 | Okada et al. | 250/370.11 |
| 6,638,782 B1 | 10/2003 | Izumi et al. | |
| 6,649,438 B1 | 11/2003 | Izumi et al. | |
| 6,753,915 B1 * | 6/2004 | Mochizuki | 348/302 |
| 2003/0096445 A1 | 5/2003 | Izumi et al. | |
| 2003/0100138 A1 | 5/2003 | Izumi et al. | |

FOREIGN PATENT DOCUMENTS

| | | |
|---|---|---|
| JP | 1-216290 | 8/1989 |
| JP | 2-164067 | 6/1990 |
| JP | 05-67016 U | 9/1993 |
| JP | 06-334158 A | 12/1994 |
| WO | WO 92 06501 | 4/1992 |

OTHER PUBLICATIONS

SPIE, vol. 1443 Medical Imaging V: Image Physics (1991). pp. 108-119.
"Materials Parameters in Thick Hydrogenated Amorphous Silicon Radiation Detectors", Lawrence Laboratory, University of California, Berkeley, CA 94720.

* cited by examiner

Primary Examiner—David Porta
Assistant Examiner—Mindy Vu
(74) Attorney, Agent, or Firm—Sughrue Mion, PLLC

(57) ABSTRACT

Disclosed is a solid state detector which comprises a photo-conductive layer for generating charges upon irradiation of recording light and a substrate laminated to the photo-conductive layer, the substrate having a thermal expansion coefficient different from that of the photo-conductive layer. The solid state detector prevents deformation and break-downs due to temperature changes of environments. Specifically, the solid state detector comprises a photo-conductive layer and a substrate laminated to the photo-conductive layer, the substrate having a thermal expansion coefficient smaller than that of the photo-conductive layer. In the solid state detector a deformation suppression layer, which has a thermal expansion coefficient smaller than that of the photo-conductive layer and suppresses deformation resulting from thermal expansion of the photo-conductive layer and the substrate, is laminated on a side of the photo-conductive layer opposite from the side of the substrate.

9 Claims, 2 Drawing Sheets

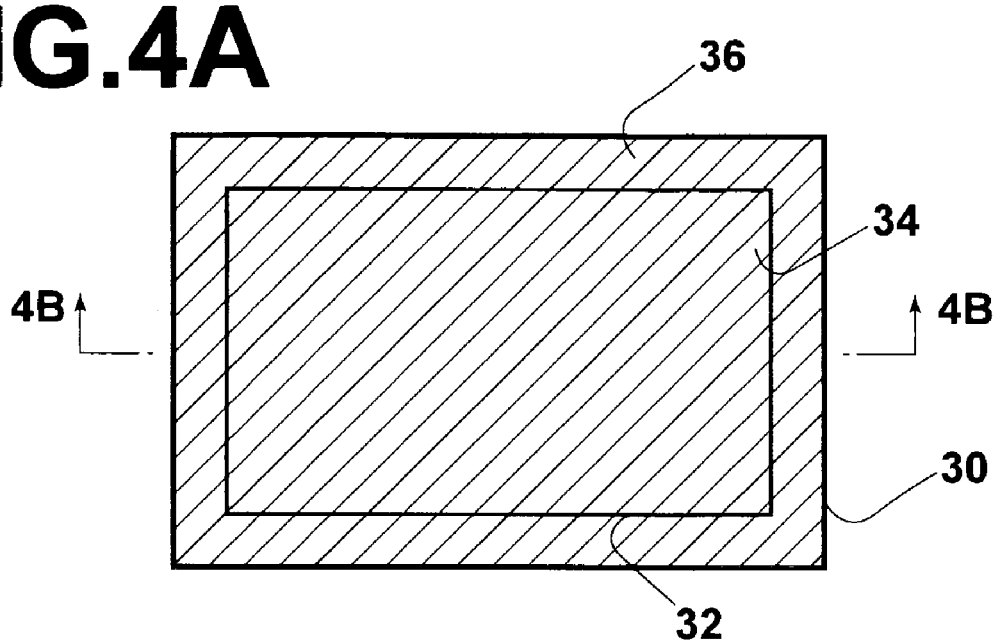
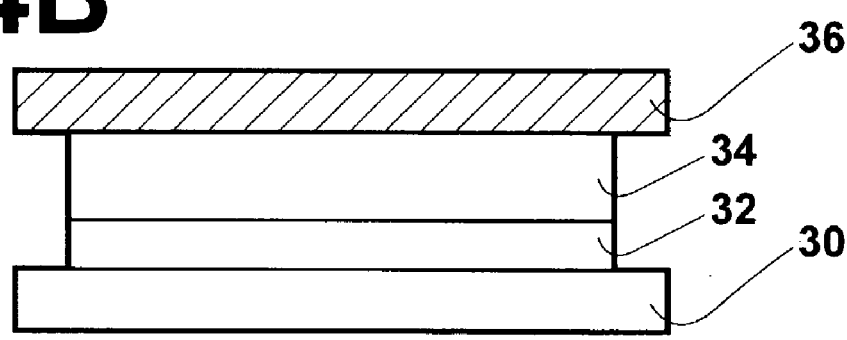

SOLID STATE DETECTOR

BACKGROUND OF THE INVENTION

1. Field of the Invention

The present invention relates to a solid state detector in which a substrate and a photo-conductive layer for generating charges upon irradiation of recording electromagnetic waves, which hold image information, are integrally laminated. The present invention relates also to a solid state detector in which a substrate and a photo-conversion layer for emitting light upon the irradiation of the recording electromagnetic waves are integrally laminated.

2. Description of the Related Art

In radiography performed for the purpose of medical diagnoses and the like, a radiation image recording/reading apparatus which uses a radiation solid state detector to detect radiation and output image signals expressing radiation image information, has been known. As the radiation solid state detector used in this apparatus, various types of detectors have been proposed and put into practical use.

In terms of charge generation processes for converting radiation into charges, there is, for example, a photo-conversion type radiation solid state detector which obtains signal charges by detecting fluorescence, which is emitted from a fluorescent substance upon irradiation of the radiation, by a photoelectric transducer thereof, where signal charges are to be stored in a charge storage portion of the photoelectric transducer, after which the storage charges are converted to an image signal and outputted (for example, U.S. Pat. No. 4,803,359 and Japanese Unexamined Patent Publication No. 2(1990)-164067, PCT International Publication No. WO92/06501, and SPIE Vol. 1443 Medical Imaging V; Image Physics (1991), pp. 108–119 etc.). There is also a direct conversion type radiation solid state detector which collects signal charges generated in a photo (radiation)-conductive layer upon irradiation of radiation by a charge collection electrode thereof, to be temporarily stored in a charge storage portion, where the storage charges are converted to an electrical signal and outputted (MATERIAL PARAMETERS IN THICK HYDROGENATED AMORPHOUS SILICON RADIATION DETECTORS, Lawrence Berkeley L. University of California, Berkeley, Calif. 94720 Xerox Parc. Palo Alto, Calif. 94304, Metal/Amorphous Silicon Multilayer Radiation Detectors, IEEE TRANSACTIONS ON NUCLEAR SCIENCE. VOL. 36. NO. 2. APRIL 1989, and Japanese Unexamined Patent Publication No. 1(1989)-216290 etc.).

Furthermore, in terms of charge reading-out processes for reading out stored charges to the outside, there is a TFT (thin film transistor) readout type solid state detector for scanning-driving TFTs coupled to a charge storage portion to read out the stored charges. There is also an optical readout solid state detector for irradiating reading light (reading electromagnetic wave) thereto to read out the charges.

In addition, there has been proposed an improved direct conversion type radiation solid state detector in U.S. Pat. Nos. 6,268,614 and 6,376,857. The improved direct conversion type radiation solid state detector adopts a direct conversion type and an optical readout type. The improved direct conversion type radiation solid state detector is constituted by sequentially laminating a first electrode layer which is transmissible by recording radiation; a photo-conductive layer for recording, which exhibits photo-conductivity (to be precise, radiation conductivity) upon irradiation of recording radiation, which transmits through the first electrode layer; a charge transport layer acting substantially as an insulative substance for charges of the same polarity as that of charges held in the first electrode layer and acting substantially as a conductive substance for charges of the opposite polarity to that of the charges; a photo-conductive layer for reading, which shows photo-conductivity (to be precise, electromagnetic wave conductivity) upon irradiation of a reading electromagnetic wave; and a second electrode layer which is transmissible by the reading electromagnetic wave. The improved direct conversion type radiation solid state detector stores signal charges (latent image charges), which hold image information, in an interface (storage portion) between the photo-conductive layer for recording and the charge transport layer.

Herein, in the above described direct conversion type and improved direct conversion type radiation solid state detectors, the photo-conductive layer is usually formed on a substrate made of glass or the like. Furthermore, also in the photo-conversion type radiation solid state detector, a photo-conversion layer containing a fluorescent substance and the like, which converts radiation to light, is formed on a substrate made of glass or the like.

However, when the photo-conductive layer or the photo-conversion layer is laminated to the substrate made of glass or the like as described above, a thermal expansion coefficient of the photo-conductive layer or the photo-conversion layer differs from that of the substrate. This leads to deformation of the photo-conductive layer or the photo-conversion layer as a result of temperature change in the environments thereof. Extreme deformation leads to the deformation of a read out radiation image, and the possibility of a breakdown of the radiation solid state detector.

SUMMARY OF THE INVENTION

In view of the foregoing problems, an object of the present invention is to provide a solid state detector in which the foregoing photo-conductive layer or the like and a substrate having a thermal expansion coefficient different from that of the photo-conductive layer or the like are laminated, wherein deformations and breakdowns caused by temperature changes in the environment are prevented.

A solid state detector of a first aspect of the present invention is one in which a photo-conductive layer generating charges upon irradiation of recording electromagnetic waves, which hold image information, to store the charges therein, and a substrate having a thermal expansion coefficient smaller than that of the photo-conductive layer are laminated, wherein a deformation suppression layer, which has a thermal expansion coefficient smaller than that of the photo-conductive layer and suppresses the deformations, resulting from thermal expansion of the photo-conductive layer and the substrate, is laminated on the side of the photo-conductive layer opposite from the side of the substrate.

Herein, the foregoing "electromagnetic wave for recording" means, for example, radiation.

Furthermore, the foregoing "photo-conductive layer" means a layer containing a-Se, lead oxide (II) such as PbO and lead iodide such as $PbI_2$ and organic polymer nanocomposite such as $HgI_2$, $Bi_{12}(Ge,Si)O_{20}$ and $Bi_2I_3$ as main components.

Furthermore, the foregoing "which has a thermal expansion coefficient smaller than that of the photo-conductive layer" does not mean that any thermal expansion coefficient will do as long as the deformation suppression layer has a thermal expansion coefficient smaller than that of the photo-conductive layer. The thermal expansion coefficient must be within a range where the total deformation of the substrate and the photo-conductive layer that might have been caused by the relationship between the respective thermal expansion coefficients of the substrate and the photo-conductive layer if no deformation suppression layer exists can be suppressed.

When the thermal expansion coefficient is smaller than that of the substrate, the thermal expansion coefficient is made to be of a value that does not lead to deformation due to the relationship of the thermal expansion coefficients between the substrate and the deformation suppression layer.

Furthermore, in the solid state detector of the first aspect of the present invention, the substrate can be made of glass, and the photo-conductive layer can be made of a-Se. The deformation suppression layer can be made of carbon fiber or aluminum.

A solid state detector of a second aspect of the present invention is one in which a photo-conductive layer generating charges upon irradiation of recording electromagnetic waves, which hold image information, to store the charges therein, and a substrate having a thermal expansion coefficient larger than that of the photo-conductive layer are laminated, wherein a deformation suppression layer, which has a thermal expansion coefficient larger than that of the photo-conductive layer and suppresses the deformations, resulting from thermal expansion of the photo-conductive layer and the substrate, is laminated on the side of the photo-conductive layer opposite from the side of the substrate.

Furthermore, the foregoing "which has a thermal expansion coefficient larger than that of the photo-conductive layer" does not mean that any thermal expansion coefficient will do as long as the deformation suppression layer has a thermal expansion coefficient larger than that of the photo-conductive layer. The thermal expansion coefficient must be within a range where the total deformation of the substrate and the photo-conductive layer that might have been caused by the relationship between the respective thermal expansion coefficients of the substrate and the photo-conductive layer if no deformation suppression layer exists can be suppressed.

Furthermore, in the solid state detector of the second aspect of the present invention, the substrate and the deformation suppression layer can be made of plastic, and the photo-conductive layer can be made of a-Se.

A solid state detector of a third aspect of the present invention is one in which a photo-conversion layer for emitting light in accordance with image information upon irradiation of recording electromagnetic waves, which hold the image information, and a substrate having a thermal expansion coefficient smaller than that of the photo-conversion layer are laminated, wherein a deformation suppression layer, which has a thermal expansion coefficient smaller than that of the photo-conversion layer and suppresses the deformations, resulting from thermal expansion of the photo-conversion layer and the substrate, is laminated on the side of the photo-conversion layer opposite from the side of the substrate.

Herein, the foregoing "photo-conversion layer" means a layer containing a fluorescent substance such as GOS, CsI:Ti and the like as main components.

Furthermore, the foregoing "which has a thermal expansion coefficient smaller than that of the photo-conversion layer" does not mean that any thermal expansion coefficient will do as long as the deformation suppression layer has a thermal expansion coefficient smaller than that of the photo-conversion layer. The thermal expansion coefficient must be within a range where the total deformation of the substrate and the photo-conversion layer that might have been caused by the relationship between the respective thermal expansion coefficients of the substrate and the photo-conversion layer if no deformation suppression layer exists can be suppressed.

Furthermore, in the solid state detector of the third aspect of the present invention, the substrate can be made of glass, and the photo-conversion layer can be made of GOS or CsI:I. The deformation suppression layer can be made of carbon fiber.

Still furthermore, in the solid state detector of the third aspect of the present invention, the substrate can be made of glass, and the photo-conversion layer can be made of GOS or CsI:I. The deformation suppression layer can be made of aluminum.

A solid state detector of a fourth aspect of the present invention is the one in which a photo-conversion layer for emitting light in accordance with image information upon irradiation of recording electromagnetic waves, which hold the image information, and a substrate having a thermal expansion coefficient larger than that of the photo-conversion layer are laminated, wherein a deformation suppression layer, which has a thermal expansion coefficient larger than that of the photo-conversion layer and suppresses the deformations, resulting from thermal expansion of the photo-conversion layer and the substrate, is laminated on the side of the photo-conversion layer opposite from the side of the substrate.

Furthermore, the foregoing "which has a thermal expansion coefficient larger than that of the photo-conversion layer" does not mean that any thermal expansion coefficient will do as long as the deformation suppression layer has a thermal expansion coefficient larger than that of the photo-conversion layer. The thermal expansion coefficient must be within a range where the total deformation of the substrate and the photo-conversion layer that might have been caused by the relationship between the respective thermal expansion coefficients of the substrate and the photo-conversion layer if no deformation suppression layer exists can be suppressed.

Furthermore, in the solid state detector of the fourth aspect of the present invention, the substrate and the deformation suppression layer can be made of plastic, and the photo-conversion layer can be made of GOS or CsI:I.

The solid state detectors of the third and fourth aspects of the present invention include solid state detectors with a charge conversion layer for converting light generated in the photo-conversion layer to charges.

Furthermore, in the solid state detectors of the first through fourth aspects of the present invention, the solid state detectors can employ a deformation suppression layer having a thermal expansion layer approximately equal to that of the substrate.

Still furthermore, a deformation suppression layer having an energy transmissivity of 50% or more for the recording electromagnetic wave should be used.

Still furthermore, a deformation suppression layer having a specific gravity smaller than that of glass should be used.

Still furthermore, the deformation suppression layer should be grounded to avoid adverse influences of static electricity on the solid state detector.

According to the solid state detectors of the first and second aspects of the present invention, since the deformation suppression layer for suppressing deformations, resulting from thermal expansion of the photo-conductive layer and the substrate, is laminated on the side of the photo-conductive layer opposite from the side of the substrate, the deformation and breakdown due to temperature changes in their environments can be prevented.

According to the solid state detectors of the third and fourth aspects of the present invention, since the deformation suppression layer for suppressing deformations, resulting from thermal expansion of the photo-conversion layer and the substrate, is laminated on the side of the photo-conversion layer opposite from the side of the substrate, the deformation and breakdown due to temperature changes in their environments can be prevented like the solid state detectors of the first and second aspects of the present invention.

Furthermore, when the deformation suppression layer has a thermal expansion coefficient approximately equal to that of the substrate, the deformation and breakdown prevention effects for the temperature change can be further enhanced.

Sill furthermore, when the energy transmissivity of the recording electromagnetic waves through the deformation suppression layer is 50% or more, it is possible to prevent the foregoing deformation and breakdown without effecting serious adverse influences on the recording of an image.

Still furthermore, when a material having a specific gravity equal to that of glass or less, for example, carbon fiber, is used as the deformation suppression layer, an increase in weight due to the provision of the deformation suppression layer can be decreased.

Still furthermore, when the deformation suppression layer is grounded, influences of static electricity and the like, which are caused in the deformation suppression layer, can be suppressed.

BRIEF DESCRIPTION OF THE DRAWINGS

FIGS. 4A and 4B are schematic constitutions of a radiation solid state detector to which still another embodiment of the solid state detector according to the present invention is applied.

DESCRIPTION OF THE PREFERRED EMBODIMENTS

Figure 1A:
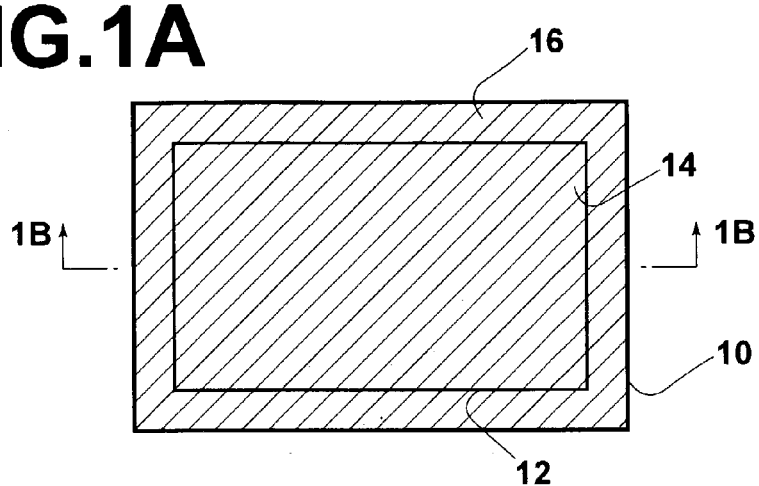
FIGS. 1A and 1B show a schematic constitution of a radiation solid state detector to which an embodiment of a solid state detector according to the present invention is applied.
Figure 1B:
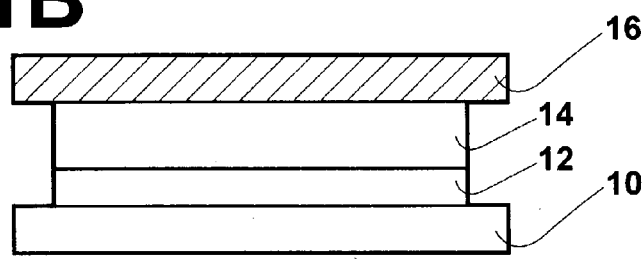

Embodiments of a solid state detector of the present invention will be described with reference to the accompanying drawings below. FIGS. 1A and 1B show schematic constitutions of a radiation solid state detector to which a solid state detector according to the present invention is applied. FIG. 1A is a plan view of the radiation solid state detector, and FIG. 1B is a section view taken along the line 1B—1B of FIG. 1A.

The radiation solid state detector of this embodiment irradiates recording electromagnetic waves (for example, X-rays, hereinafter, referred to as recording light), which hold radiation image information, whereby the radiation image information is recorded as an electrostatic latent image. The electrostatic latent image is scanned by reading electromagnetic waves (hereinafter, referred to as reading light), whereby a current in accordance with the electrostatic latent image is generated. To be more specific, a substrate 10; a detecting portion 12 for detecting charges generated in a photo-conductive layer 14 upon irradiation of the recording light to be described later; the photo-conductive layer 14 for generating charges by the irradiation of the recording light and for storing the charges therein; and a deformation suppression layer 16 for suppressing occurrence of a deformation of the radiation solid state detector due to the difference in thermal expansion coefficients between the photo-conductive layer 14 and the substrate 10; are sequentially laminated in this order.

In the radiation solid state detector of this embodiment, the recording light is irradiated from the direction of the deformation suppression layer 16 thereto, and the photo-conductive layer 14 generates charges in response to the irradiation of the recording light to store the charges therein. The detection portion 12 reads out the charges stored in the photo-conductive layer 14.

The substrate 10 is a glass substrate, and has a thermal expansion coefficient smaller than that of the photo-conductive layer 14.

The detection portion 12 is composed of a large number of TFTs, and reads out the charges stored in the photo-conductive layer while turning the TFTs of respective pixels on and off, one by one.

As the photo-conductive layer 14, a-Se, a lead oxide (II) such as PbO, a lead iodide such as $PbI_2$, and an organic polymer nanocomposite such as $HgI_2$, $Bi_{12}(Ge, Si) O_{20}$ and $Bi_2I_3$ can be utilized.

The deformation suppression layer 16 is made of a material which has a thermal expansion coefficient smaller than that of the photo-conductive layer 14 and close to that of the substrate 10 and does not disturb transmission of the recording light. The transmissivity of the recording light should be 50% or more. For example, a carbon fiber plate and aluminum can be utilized. However, since the carbon fiber plate and aluminum are conductive, the deformation suppression layer 16 should be grounded in order to avoid influences due to static electricity on the photo-conductive layer 14.

According to the radiation solid state detector of this embodiment, since the deformation suppression layer 16 for suppressing the deformations of the photo-conductive layer and the substrate due to thermal expansion is laminated on the side of the photo-conductive layer 14 opposite from the side of the substrate 10, the deformation and breakdown due to temperature changes in its environment can be prevented.

Figure 2:
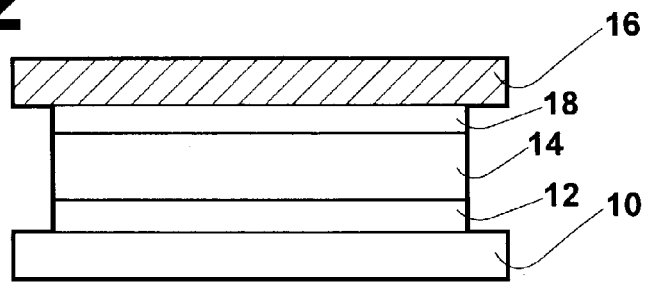
FIG. 2 shows a schematic constitution of another embodiment of the radiation solid state detector shown in FIG. 1.
Figure 3:
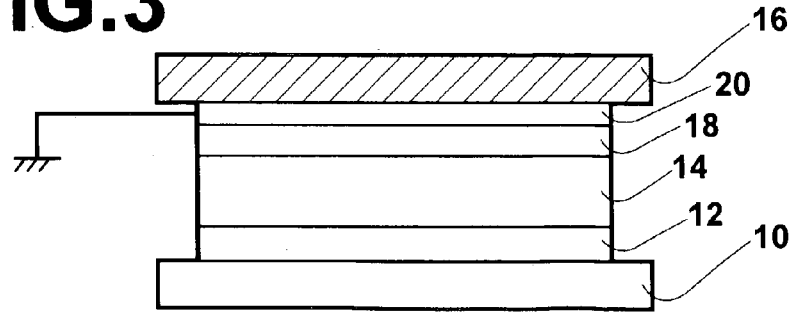
FIG. 3 shows a schematic constitution of still another radiation solid state detector shown in FIG. 1.

Furthermore, in the above described embodiment, an insulation layer 18 may be provided between the deformation suppression layer 16 and the photo-conductive layer 14 as shown in FIG. 2. As shown in FIG. 3, a grounded conductive layer 20 may be provided between the deformation suppression layer 16 and the insulation layer 18. Influences of static electricity and the like on the photo-conductive layer 14 can be avoided by providing the insulating layer 18 and the conductive layer 20 as described above.

Furthermore, in the above described embodiment, though glass, having a thermal expansion coefficient smaller than that of the photo-conductive layer 14, is used as the material of the substrate 10, a material having a thermal expansion coefficient larger than that of the photo-conductive layer 14 may be used as the material of the substrate 10. In this case, a material having a thermal expansion coefficient larger than that of the photo-conductive layer 14 may be used as the material of the deformation suppression layer 16. For example, plastic can be used as the materials of the substrate 10 and the deformation suppression layer 16.

Furthermore, in the above described embodiment, though the detection portion 12 is composed of the TFTs, the constitution of the detection portion 12 is not limited to this, and an optical readout type detection portion may be provided.

Furthermore, in the above described embodiment, the constitution of the solid state detector is not limited to the above, and a solid state detector having any known constitution can be used. For example, when the improved direct conversion type solid state detector is used, a first electrode layer which is transmissible toward recording radiation; a photo-conductive layer for recording, which exhibits photo-conductivity (to be precise, radiation conductivity) upon irradiation of recording radiation thereon, which transmits through the foregoing first electrode layer; a charge transport layer acting substantially as an insulative substance for charges of the same polarity as that of charges held in the first electrode layer and acting substantially as a conductive substance for charges of the opposite polarity to that of the charges; a photo-conductive layer for reading, which shows photoconductivity (to be precise, electromagnetic wave conductivity) upon irradiation of a reading electromagnetic wave; a second electrode layer which is transmissible toward the reading electromagnetic wave; and a glass substrate are sequentially laminated. A deformation suppression layer 16 used in the above described embodiment can be provided on the upper surface of the first electrode layer. In this case, since a thermal expansion coefficient of the glass substrate is smaller than that of the photo-conductive layer for recording, a thermal expansion coefficient of the deformation suppression layer 16 must be set to be smaller than that of the photo-conductive layer for recording.

In this embodiment, the solid state detector of the present invention is applied to the radiation solid state detector which detects the charges generated in the photo-conductive layer by the irradiation of the recording light. The solid state detector of the present invention can be applied also to a radiation solid state detector which emits light by irradiation of recording light and detects the emitted light. In this case, as shown in FIGS. 4A and 4B (FIG. 4A is a plan view, and FIG. 4B is a section view taken along the line 4B—4B of FIG. 4A), a substrate 30; a detection portion 32 for detecting fluorescence emitted in a photo-conversion layer 34 to be described later by irradiation of recording light; the photo-conversion layer 34 for emitting the fluorescence upon the irradiation of the recording light; and a deformation suppression layer 36 for suppressing occurrence of deformation of a radiation solid state detector 30 due to a difference in thermal expansion coefficients between the photo-conversion layer 34 and the substrate 30 are sequentially laminated in this order. As the foregoing photo-conversion layer, a layer containing a fluorescent substance such as GOS and CsI:Ti as main components may be used.

In the above described embodiments, when the thermal expansion coefficient of the photo-conversion layer 34 is larger than that of the substrate 30, a thermal expansion coefficient made smaller than that of the photo-conversion layer 34 is satisfactory for the deformation suppression layer 36. When the thermal expansion coefficient of the photo-conversion layer 34 is smaller than that of the substrate, a thermal expansion coefficient made larger than that of the photo-conversion layer 34 is satisfactory for the deformation suppression layer 36. As materials for the substrate 30 and the deformation suppression layer 36, materials which are the same as the above materials can be used. Furthermore, the foregoing detection portion 32 may be constituted by providing on each pixel a photo-conversion device which converts the foregoing fluorescence to charges, and a TFT which reads out the charges converted. Furthermore, the detection portion 32 maybe constituted by a photo-conductive layer which generates charges by fluorescence emitted by the photo-conversion layer 34 and stores them therein, and an electrode which reads out the charges from the photo-conductive layer.

What is claimed is:

1. A solid state detector, comprising:
    a photo-conductive layer generating charges upon irradiation of recording electromagnetic waves, which hold image information; and
    a substrate laminated to the photo-conductive layer, the substrate having a thermal expansion coefficient smaller than that of the photo-conductive layer,
    wherein a deformation suppression layer, which is not an electrode, has a thermal expansion coefficient smaller than that of the photo-conductive layer, and suppresses deformation resulting from thermal expansion of the photo-conductive layer and the substrate, is laminated on a side of the photo-conductive layer opposite from the side of the substrate.

2. The solid state detector according to claim 1, wherein the substrate is made of glass, the photo-conductive layer is made of a-Se, and the deformation suppression layer is made of one of carbon fiber and aluminum.

3. The solid-state detector according to claim 1, wherein the deformation suppression layer is laminated directly to the photo-conductive layer on a side of the photo-conductive layer opposite from the side of the substrate.

4. The solid state detector according to claim 1, wherein the deformation suppression layer has a thermal expansion coefficient smaller than that of the photo-conductive layer and the substrate.

5. A solid state detector, comprising
    a photo-conversion layer for emitting light in accordance with image information upon irradiation of recording electromagnetic waves, which hold the image information; and
    a substrate laminated to the photo-conversion layer, the substrate having a thermal expansion coefficient smaller than that of the photo-conversion layer,
    wherein a deformation suppression layer, which has a thermal expansion coefficient smaller than that of the photo-conversion layer and suppresses deformation resulting from thermal expansion of the photo-conversion layer and the substrate, is laminated on a side of the photo-conversion layer opposite from the side of the substrate.

6. The solid state detector according to claim 5, wherein the substrate is made of glass, the photo-conversion layer is made of one of GOS and CsI:I , and the deformation suppression layer is made of carbon fiber.

7. The solid state detector according to claim 5, wherein the substrate is made of glass, the photo-conversion layer is made of one of GOS and CsI:I, and the deformation suppression layer is made of aluminum.

8. The solid-state detector according to claim 5, wherein the substrate is laminated directly on the photo-conductive layer and the deformation suppression layer is laminated directly to the photo-conductive layer on a side of the photo-conductive layer opposite from the side of the substrate.

9. The solid state detector according to claim 5, wherein the deformation suppression layer has a thermal expansion coefficient smaller than that of the photo-conductive layer and the substrate.

* * * * *